United States Patent
Watanabe

(10) Patent No.: US 10,608,682 B2
(45) Date of Patent: Mar. 31, 2020

(54) RADIO FREQUENCY MODULE

(71) Applicant: Murata Manufacturing Co., Ltd., Kyoto (JP)

(72) Inventor: Takashi Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/567,201

(22) Filed: Sep. 11, 2019

(65) Prior Publication Data

US 2020/0007174 A1    Jan. 2, 2020

Related U.S. Application Data

(63) Continuation of application No. PCT/JP2018/009052, filed on Mar. 8, 2018.

(30) Foreign Application Priority Data

Mar. 14, 2017    (JP) .................. 2017-048707

(51) Int. Cl.
*H04B 1/04* (2006.01)
*H03F 3/195* (2006.01)
(Continued)

(52) U.S. Cl.
CPC .............. *H04B 1/04* (2013.01); *H03F 3/195* (2013.01); *H03F 3/245* (2013.01); *H04B 1/0042* (2013.01);
(Continued)

(58) Field of Classification Search
CPC .......... H04B 1/04; H04B 1/0042; H04B 1/16; H03F 3/195; H03F 3/245; H03H 11/362;
(Continued)

(56) References Cited

U.S. PATENT DOCUMENTS 6,075,491 A * 6/2000 Dakeya .................. H01Q 1/362
343/700 MS
8,502,616 B2 * 8/2013 Kato ........................ H01P 1/36
333/1.1
(Continued)

FOREIGN PATENT DOCUMENTS

JP    H06-96992 A    4/1994
JP    2004-111938 A    4/2004
(Continued)

OTHER PUBLICATIONS

International Search Report for International Application No. PCT/JP2018/009052 dated May 1, 2018.
(Continued)

*Primary Examiner* — James M Perez
(74) *Attorney, Agent, or Firm* — Pearne & Gordon LLP

(57) ABSTRACT

An amplifier circuit unit of a radio frequency module is mounted on a substrate with a first external terminal interposed therebetween, a switch circuit unit is mounted on the substrate with a second external terminal interposed therebetween, and a matching circuit unit is mounted on the substrate with a first terminal and a second terminal interposed therebetween. The first terminal is electrically connected to the second external terminal of the switch circuit unit, and the second terminal is electrically connected to the first external terminal of the amplifier circuit unit. When viewed from a direction perpendicular to one main surface of the substrate, the first terminal is superposed with the second external terminal of the switch circuit unit, and the second terminal is superposed with the first external terminal of the amplifier circuit unit.

15 Claims, 5 Drawing Sheets

(51) Int. Cl.
*H04B 1/00* (2006.01)
*H03F 3/24* (2006.01)

(52) U.S. Cl.
CPC ............... *H03F 2200/451* (2013.01); *H04B 2001/0408* (2013.01)

(58) Field of Classification Search
CPC ......... H03H 2007/386; H03H 2250/00; H03H 7/38; H03H 9/64; H03H 9/72
See application file for complete search history.

(56) References Cited

U.S. PATENT DOCUMENTS

| | | | | |
|---|---|---|---|---|
| 8,525,610 | B2* | 9/2013 | Kato | B23K 1/0016 333/1.1 |
| 8,692,628 | B2* | 4/2014 | Ishiyama | H01P 1/387 333/24.2 |
| 9,178,489 | B2* | 11/2015 | Yoshimi | H01P 1/387 |
| 9,319,006 | B2* | 4/2016 | Solomko | H01P 5/18 |
| 9,402,314 | B2* | 7/2016 | Maruyama | H05K 1/165 |
| 9,647,775 | B1* | 5/2017 | Tsutsui | H04B 15/00 |
| 9,780,735 | B1* | 10/2017 | Obiya | H03F 1/26 |
| 9,871,541 | B2* | 1/2018 | Tsutsui | H04B 15/00 |
| 9,887,718 | B2* | 2/2018 | Watanabe | H03H 7/38 |
| 9,917,615 | B2* | 3/2018 | Kogure | H04B 1/525 |
| 9,923,542 | B2* | 3/2018 | Kikuchi | H03H 7/463 |
| 10,069,523 | B2* | 9/2018 | Tsutsui | H03F 3/245 |
| 10,084,418 | B2* | 9/2018 | Yanagihara | H03F 3/213 |
| 10,193,530 | B2* | 1/2019 | Takamine | H03H 7/38 |
| 10,211,864 | B2* | 2/2019 | Watanabe | H03H 7/01 |
| 10,250,214 | B2* | 4/2019 | Kato | H03H 7/01 |
| 10,291,269 | B2* | 5/2019 | Tsutsui | H04B 15/00 |
| 10,340,863 | B2* | 7/2019 | Okabe | H03F 3/68 |
| 10,361,473 | B2* | 7/2019 | Okabe | H01P 5/18 |
| 10,381,989 | B2* | 8/2019 | Aikawa | H03F 1/565 |
| 10,382,009 | B2* | 8/2019 | Nosaka | H03H 7/38 |
| 10,389,310 | B2* | 8/2019 | Nakajima | H03F 3/193 |
| 10,424,841 | B2* | 9/2019 | Kuroda | H03H 7/0115 |
| 10,432,236 | B2* | 10/2019 | Ueno | H03H 7/38 |
| 10,454,434 | B2* | 10/2019 | Sato | H03F 3/245 |
| 10,454,450 | B2* | 10/2019 | Uejima | H03H 7/38 |
| 2004/0041256 | A1 | 3/2004 | Takehara et al. | |
| 2007/0026196 | A1 | 2/2007 | Ogawa et al. | |
| 2007/0107933 | A1 | 5/2007 | Yamamoto et al. | |
| 2008/0169884 | A1* | 7/2008 | Matsumoto | H03H 3/04 333/187 |
| 2008/0238567 | A1* | 10/2008 | Rosetti | H03H 7/46 333/17.3 |
| 2010/0289608 | A1 | 11/2010 | Nabeshima et al. | |
| 2010/0295629 | A1* | 11/2010 | Klemens | H03F 1/56 333/126 |
| 2012/0075032 | A1* | 3/2012 | Kato | B23K 1/0016 333/1.1 |
| 2012/0163247 | A1* | 6/2012 | Shimamoto | H04B 1/006 370/278 |
| 2013/0154757 | A1* | 6/2013 | Kato | H01P 1/36 333/1.1 |
| 2014/0015620 | A1* | 1/2014 | Ishiyama | H01P 1/387 333/24.2 |
| 2014/0160693 | A1* | 6/2014 | Maruyama | H05K 1/165 361/748 |
| 2016/0037640 | A1 | 2/2016 | Takai et al. | |
| 2016/0156328 | A1* | 6/2016 | Takeuchi | H03H 9/0009 333/124 |
| 2017/0077982 | A1* | 3/2017 | Obkircher | H04B 1/401 |
| 2017/0141801 | A1* | 5/2017 | Watanabe | H03H 9/70 |
| 2017/0194993 | A1* | 7/2017 | Watanabe | H03H 7/38 |
| 2017/0264337 | A1* | 9/2017 | Kogure | H04B 1/525 |
| 2018/0123628 | A1* | 5/2018 | Watanabe | H03H 7/38 |
| 2019/0140678 | A1* | 5/2019 | Watanabe | H03H 7/38 |

FOREIGN PATENT DOCUMENTS

| | | |
|---|---|---|
| JP | 2006-049602 A | 2/2006 |
| JP | 2007-115852 A | 5/2007 |
| JP | 2009-177040 A | 8/2009 |
| JP | 4337822 B2 | 9/2009 |
| JP | 2012-191654 A | 10/2012 |
| JP | 2012-238799 A | 12/2012 |
| WO | 2005/101935 A1 | 10/2005 |
| WO | 2010/052839 A1 | 5/2010 |
| WO | 2014/171225 A1 | 10/2014 |

OTHER PUBLICATIONS

Written Opinion for International Application No. PCT/JP2018/009052 dated May 1, 2018.

\* cited by examiner

RADIO FREQUENCY MODULE

This is a continuation of International Application No. PCT/JP2018/009052 filed on Mar. 8, 2018 which claims priority from Japanese Patent Application No. 2017-048707 filed on Mar. 14, 2017. The contents of these applications are incorporated herein by reference in their entireties.

BACKGROUND

Technical Field

The present disclosure relates to a radio frequency (RF) module that amplifies and transfers radio frequency (RF) signals.

In recent years, higher-density integration has been achieved for, for example, a switch circuit component and an amplifier circuit component that are components included in an RF module. As higher-density integration has been achieved for these components, wiring for connecting the components and wiring for connecting the components to a matching element have become more complicated.

As an example of this type of RF module, Patent Document 1 describes an RF module including an integrated circuit device built in a substrate and an inductor device mounted on one main surface of the substrate. In this RF module, signal processing is performed on an input RF signal using a signal processing circuit included in the integrated circuit device.

Patent Document 1: Japanese Unexamined Patent Application Publication No. 2012-238799

BRIEF SUMMARY

However, in the RF module described in Patent Document 1, there may be a case where, depending on the design of a wire between the integrated circuit device and the inductor device, a parasitic capacitance may be generated between this wire and another wire and the RF signal processing may be adversely affected. In particular, in a case where the integrated circuit device includes an amplifier circuit, there is a problem in that the generation of a parasitic capacitance degrades the characteristics of the amplifier circuit.

The present disclosure suppresses degradation of the characteristics of an amplifier circuit due to a generated parasitic capacitance in an RF module.

A radio frequency module according to an embodiment of the present disclosure includes a substrate, a matching circuit unit mounted on one main surface of the substrate, and a switch circuit unit and an amplifier circuit unit mounted on another main surface or in an inside of the substrate, and the amplifier circuit unit has a first external terminal and is mounted on the substrate with the first external terminal interposed therebetween, the switch circuit unit has a second external terminal and is mounted on the substrate with the second external terminal interposed therebetween, the matching circuit unit has a first terminal and a second terminal, which are different from each other, and is mounted on the substrate with the first and second terminals interposed therebetween, the first terminal is electrically connected to the second external terminal of the switch circuit unit, the second terminal is electrically connected to the first external terminal of the amplifier circuit unit, and when viewed from a direction perpendicular to the one main surface of the substrate, the radio frequency module has at least one of a state in which the first terminal is superposed with the second external terminal of the switch circuit unit and a state in which the second terminal is superposed with the first external terminal of the amplifier circuit unit.

As a result of this, the first terminal of the matching circuit unit and the second external terminal of the switch circuit unit can be connected to each other with the shortest length of wire. Thus, a parasitic capacitance is less likely to be generated between the wire connecting the first terminal and the second external terminal to each other and another wiring line. In addition, the second terminal of the matching circuit unit and the first external terminal of the amplifier circuit unit can be connected to each other with the shortest length of wire. Thus, a parasitic capacitance is less likely to be generated between the wiring line connecting the second terminal and the first external terminal to each other and another wire. Consequently, degradation of the characteristics of the amplifier circuit unit due to a generated parasitic capacitance can be suppressed.

In addition, when viewed from the direction perpendicular to the one main surface of the substrate, at least, the second terminal may be superposed with the first external terminal of the amplifier circuit unit.

As a result of this, the second terminal of the matching circuit unit and the first external terminal of the amplifier circuit unit can be connected to each other with the shortest length of wire. Thus, regarding a wire that connects the first external terminal and the second terminal to each other and that is positioned near the amplifier circuit unit, generation of a parasitic capacitance can be suppressed. Consequently, degradation of the characteristics of the amplifier circuit unit due to a generated parasitic capacitance can be suppressed.

The radio frequency module may further include a first resin sealing portion formed on the one main surface of the substrate so as to cover the matching circuit unit, and a first shield film formed to cover a side surface of the substrate and a side surface of the first resin sealing portion, and when viewed from the direction perpendicular to the one main surface of the substrate, the matching circuit unit may be arranged in a central region of the substrate.

In this manner, the distance between the matching circuit unit and the first shield film is increased by arranging the matching circuit unit in the central region of the substrate, and degradation of the electric characteristics of the matching circuit unit due to the shield can be suppressed. Consequently, the electric characteristics of the matching circuit unit can be maintained, and degradation of noise factor (NF) characteristics of the amplifier circuit unit can be suppressed.

In addition, the matching circuit unit is a chip inductor and may be inserted between the switch circuit unit and the amplifier circuit unit such that the switch circuit unit, the matching circuit unit, and the amplifier circuit unit are connected in series.

In this manner, as a result of using the chip inductor as the matching circuit unit, impedance matching can be achieved between the switch circuit unit and the amplifier circuit unit by the inductor with a high quality factor. In addition, in a case where the first shield film is formed in the RF module and the chip inductor serving as the matching circuit unit is arranged in the central region of the substrate, the distance between the chip inductor and the first shield film is increased. Thus, a factor blocking the magnetic flux of the chip inductor is removed, quality factor degradation can be suppressed, and the NF characteristics of the amplifier circuit unit can be improved.

In addition, the chip inductor may be mounted on the substrate such that a coil axis is parallel to the one main surface of the substrate.

For example, when the inductor is arranged so as to intersect with the one main surface of the substrate, the magnetic field formed by the inductor may affect other circuit components. In contrast, as in the present disclosure, the effect of the magnetic field on the other circuit components can be suppressed by arranging the inductor such that the coil axis is parallel to the one main surface.

In addition, the radio frequency module may include a plurality of chip inductors that can be the same as the chip inductor mounted on the substrate, and at least two of the chip inductors among the chip inductors may be mounted on the substrate such that a coil axis of one of the chip inductors intersects with a coil axis of the other chip inductor.

In this manner, each chip inductor is oriented such that the chip inductor is less likely to block magnetic flux of the other chip inductors, thereby being less likely to interfere with the other chip inductors and suppressing occurrence of magnetic field coupling. Consequently, degradation of attenuation characteristics due to signal leakage from the RF signal channels can be suppressed.

In addition, the coil axis of the one of the chip inductors may be orthogonal to the coil axis of the other chip inductor.

In this manner, the one chip inductor is oriented to be orthogonal to the other chip inductor, thereby being less likely to interfere with the other chip inductor, suppressing occurrence of magnetic field coupling, and suppressing degradation of attenuation characteristics due to signal leakage from the RF signal channels.

The radio frequency module may further include a band pass filter connected to the switch circuit unit, and the band pass filter may be mounted on the other main surface or in the inside of the substrate.

With this RF module, signals can be transmitted and received in a plurality of frequency bands.

In addition, the switch circuit unit and the amplifier circuit unit may be mounted on the other main surface of the substrate, and the radio frequency module may further include a bump electrode that protrudes from the other main surface of the substrate, a second resin sealing portion formed on the other main surface of the substrate so as to cover a side surface of the switch circuit unit and a side surface of the amplifier circuit unit as well as a side surface of the bump electrode, and a second shield film formed so as to cover a side surface of the second resin sealing portion.

As a result of this, using the bump electrode, input-output of RF signals and connecting RF signals to the ground can be performed.

In addition, the bump electrode may have a bottom portion that is in contact with the other main surface and a leading-end portion positioned farthest from the bottom portion, the leading-end portion may be exposed from a front surface of the second resin sealing portion, and a portion of the bottom portion may be exposed from the side surface of the second resin sealing portion along the other main surface of the substrate and is connected to the second shield film.

In this manner, the ground contact area of the electrode connected to the shield film is increased by connecting the bump electrode to the second shield film and the resistance value is decreased, thereby improving the shield performance. In addition, in a case where the RF module is mounted on a motherboard, the bump electrode can be connected to the shield film at a position close to the motherboard, thereby improving the shield performance.

In addition, the bump electrode may have a bottom portion that is in contact with the other main surface and a leading-end portion positioned farthest from the bottom portion, and the leading-end portion may have a larger cross-sectional area than the bottom portion, and may be exposed from a front surface of the second resin sealing portion.

In this manner, by increasing the cross-sectional area of the leading-end portion of the bump electrode, a large area can be used to connect to a motherboard in a case where the RF module is mounted on the motherboard, thereby increasing the mounting strength.

In an RF module, degradation of the characteristics of an amplifier circuit due to a generated parasitic capacitance is suppressed.

DETAILED DESCRIPTION

Figure 1:
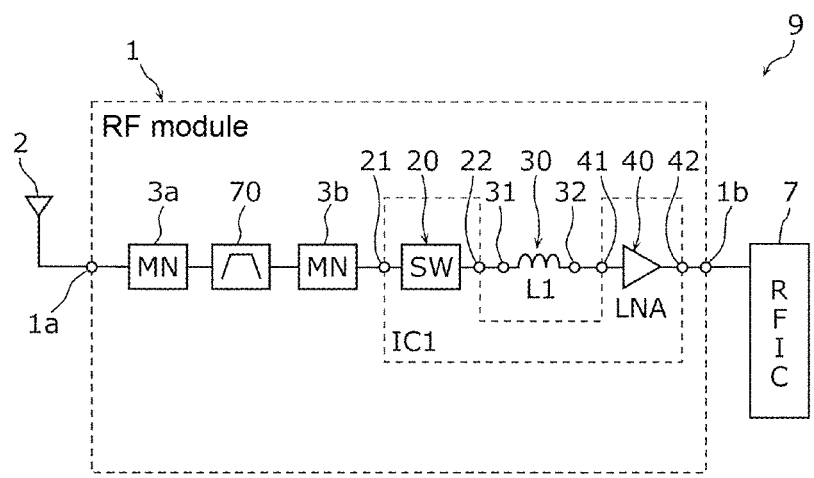
FIG. 1 is a diagram illustrating a circuit configuration of an RF module according to a first embodiment.

In the following, with reference to the drawings, radio frequency (RF) modules according to embodiments of the present disclosure will be described. Note that all the embodiments described below are operative examples of the present disclosure. The numerical values, shapes, materials, structural elements, arrangement positions of the structural elements, and connection configurations, manufacturing processes, and the sequence of the manufacturing processes indicated in the following embodiments are examples, and they are not intended to limit the present disclosure. In addition, among the structural elements according to the following embodiments, structural elements that are not stated in independent claims, which represent the most generic concept, are described as arbitrary structural elements. In addition, the sizes or the ratio between the sizes of the structural elements illustrated in the drawings are not always precise. In addition, in each of the drawings, substantially identical configurations will be denoted by the same reference numerals and redundant descriptions will be omitted or simplified.

First Embodiment 1-1. Configuration of RF Module

First, a circuit configuration of an RF module 1 according to a first embodiment will be described.

FIG. 1 is a diagram illustrating the circuit configuration of the RF module 1.

The RF module 1 is a circuit module that amplifies and transfers RF signals. An antenna element 2 is connected to an antenna terminal 1a of the RF module 1, and a radio frequency integrated circuit (RFIC) 7, which is an RF signal processing circuit, is connected to an input-output terminal 1b. Note that FIG. 1 illustrates a communication device 9 including the RF module 1 and the RFIC 7. In the present embodiment, a description will be made taking the RF module 1, which is a receiving circuit, as an example.

In the RF module 1, a matching element (MN) 3a, a band pass filter 70, a matching element (MN) 3b, a switch circuit unit 20, a matching circuit unit 30, an amplifier circuit unit 40, and the input-output terminal 1b are arranged in this order from the antenna terminal 1a in a channel connecting the antenna terminal 1a to the input-output terminal 1b. The matching element 3a is an element that achieves impedance matching between the antenna element 2 and the band pass filter 70. The matching element 3b is an element that achieves impedance matching between the band pass filter 70 and the switch circuit unit 20.

The switch circuit unit 20 has a first external terminal 21 and a second external terminal 22. The matching circuit unit 30 has a first terminal 31 and a second terminal 32. The amplifier circuit unit 40 has a first external terminal 41 and a second external terminal 42.

The first external terminal 21 of the switch circuit unit 20 is, for example, an input terminal, and is connected to the matching element 3b. The second external terminal 22 is, for example, an output terminal, and is connected to the first terminal 31 of the matching circuit unit 30. The switch circuit unit 20 is, for example, a switch IC (SW).

The first terminal 31 of the matching circuit unit 30 is, for example, an input terminal, and is connected to the second external terminal 22 of the switch circuit unit 20. The second terminal 32 is, for example, an output terminal, and is connected to the first external terminal 41 of the amplifier circuit unit 40. The matching circuit unit 30 is a circuit that achieves impedance matching between the switch circuit unit 20 and the amplifier circuit unit 40. The matching circuit unit 30 is, for example, an inductor (L1), and is inserted between the switch circuit unit 20 and the amplifier circuit unit 40 such that the switch circuit unit 20, the matching circuit unit 30, and the amplifier circuit unit 40 are connected in series.

The first external terminal 41 of the amplifier circuit unit 40 is, for example, an input terminal, and is connected to the second terminal 32 of the matching circuit unit 30. The second external terminal 42 is, for example, an output terminal, and is connected to the input-output terminal 1b of the RF module 1. The amplifier circuit unit 40 is, for example, a low-noise amplifier (LNA). In the present embodiment, the switch circuit unit 20 and the amplifier circuit unit 40 are constituted by an integrated circuit device IC1, which is an integral device.

Next, a mounting configuration of the RF module 1 will be described.

Figure 2A:
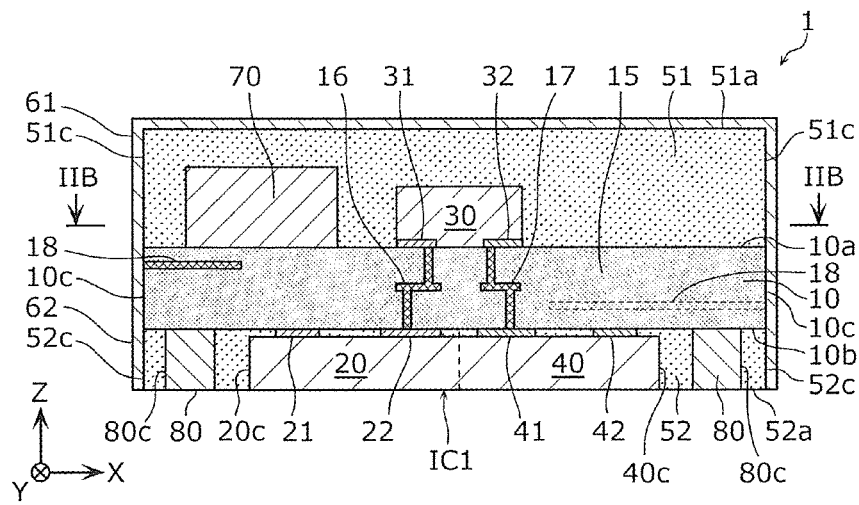
FIG. 2A is a cross section of the RF module according to the first embodiment when the RF module is viewed from the front.
Figure 2B:
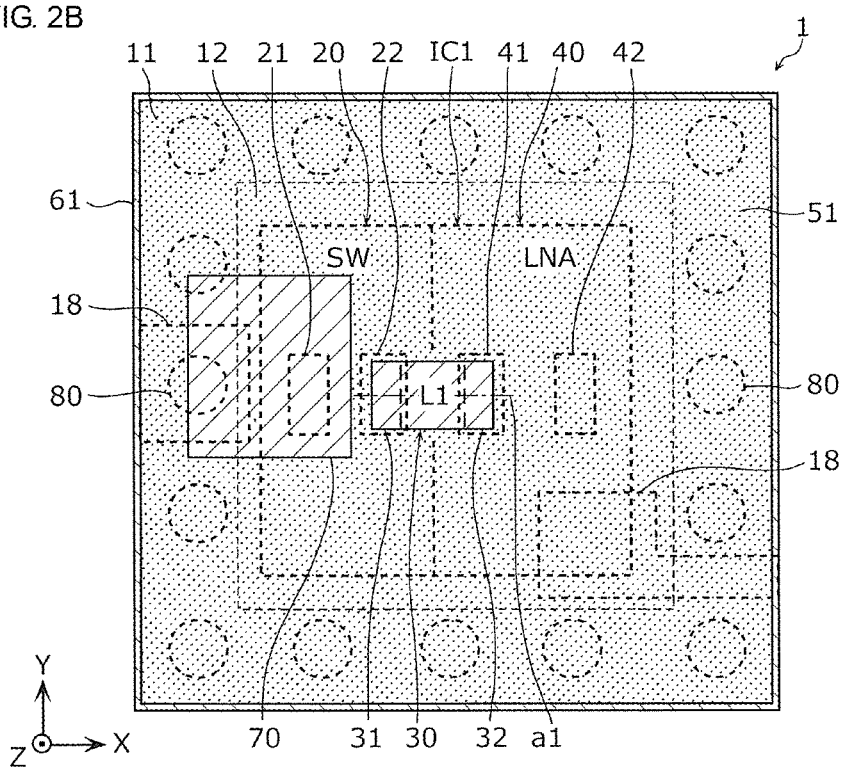
FIG. 2B is a cross section of the RF module according to the first embodiment when the RF module is viewed in a planar view.

FIG. 2A is a cross section of the RF module 1 when the RF module 1 is viewed from the front. FIG. 2B is a cross section of the RF module 1 when the RF module 1 is viewed in a planar view, and more specifically, a cross section taken along line IIB-IIB in FIG. 2A.

The RF module 1 includes, as illustrated in FIGS. 2A and 2B, a substrate 10, the matching circuit unit 30 and the band pass filter 70 mounted on one main surface 10a of the substrate 10, and the switch circuit unit 20 and the amplifier circuit unit 40 mounted on the other main surface 10b. Note that, in FIGS. 2A and 2B, illustration of the matching elements 3a and 3b is omitted. In addition, hereinafter the direction perpendicular to the one main surface 10a of the substrate 10 is called a Z direction, a predetermined direction parallel to the one main surface 10a is called an X direction, and a direction perpendicular to both the Z direction and the X direction is called a Y direction.

A plurality of bump electrodes 80, which protrude perpendicularly from the other main surface 10b are provided in a peripheral region 11 of the substrate 10. Some of the plurality of bump electrodes 80 are the antenna terminal 1a and the input-output terminal 1b described above, and some of the other bump electrodes 80 are, for example, terminals connected to the ground.

A first resin sealing portion 51 is provided on the one main surface 10a of the substrate 10 so as to cover the matching circuit unit 30 and the band pass filter 70. In addition, a first shield film 61 is provided so as to cover a side surface 10c of the substrate 10 and a side surface 51c and a top surface 51a of the first resin sealing portion 51.

A second resin sealing portion 52 is provided on the other main surface 10b of the substrate 10 so as to cover side surfaces of the integrated circuit device IC1 (a side surface 20c of the switch circuit unit 20 and a side surface 40c of the amplifier circuit unit 40) and side surfaces 80c of the bump electrodes 80. In addition, a second shield film 62 is provided so as to cover side surfaces 52c of the second resin sealing portion 52.

As materials for the first resin sealing portion 51 and the second resin sealing portion 52, for example, a thermosetting resin material such as an epoxy resin is used. As materials for the first shield film 61 and the second shield film 62, for example, Cu, Ag, Ni, or the like is used.

The band pass filter 70 is a surface acoustic wave (SAW) filter used in an arbitrary frequency band in a frequency band from 500 MHz to 6 GHz. The band pass filter 70 has a rectangular parallelepiped shape, and a plurality of signal terminals are provided on the bottom surface (unillustrated). Note that the band pass filter 70 is not limited to a SAW filter, and may also be a bulk acoustic wave filter (BAW).

In a case where the band pass filter 70 is a SAW filter, the band pass filter 70 includes a substrate and an interdigital transducer (IDT) electrode.

The substrate is a substrate that has piezoelectricity at least on its front surface. For example, the substrate has a piezoelectric thin film on the front surface and may also be constituted by a multilayer body having, for example, a film having a different acoustic velocity from the piezoelectric thin film and a supporting substrate. In addition, the entirety of the substrate may have piezoelectricity. In this case, the substrate is a piezoelectric substrate composed of a single piezoelectric layer.

The switch circuit unit 20 and the amplifier circuit unit 40 are a portion included in the integrated circuit device IC1 as described above. The integrated circuit device IC1 has a rectangular parallelepiped shape, the bottom surface is mounted on the other main surface 10b of the substrate 10, and the top surface is exposed from a front surface 52a of the second resin sealing portion 52. Specifically, the switch circuit unit 20 is soldered to the other main surface 10b of the substrate 10 with the first external terminal 21 and the second external terminal 22 interposed therebetween. The amplifier circuit unit 40 is soldered to the other main surface 10b of the substrate 10 with the first external terminal 41 and the second external terminal 42 interposed therebetween.

The matching circuit unit 30 is, for example, a chip inductor manufactured by using a method including a sheet lamination method, a printing lamination method, or a thin film formation method. The matching circuit unit 30 has, as its outer shape, a rectangular parallelepiped shape, and the first terminal 31 and the second terminal 32, which are a pair of terminals, are provided at both ends or on the bottom surface. The matching circuit unit 30 is soldered to the one main surface 10a of the substrate 10 with the first terminal 31 and the second terminal 32 interposed therebetween. In the present embodiment, an inductor having a high quality factor Q is employed as the matching circuit unit 30.

The matching circuit unit 30, which is a chip inductor, is mounted on the substrate 10 such that a coil axis a1 of the inductor is parallel to the one main surface 10a of the substrate 10 (parallel to the X direction in the present embodiment). In addition, the matching circuit unit 30 is arranged in a central region 12 of the substrate 10 so as not to be too close to the first shield film 61. In addition, the matching circuit unit 30, which is an inductor, is configured to be spaced apart from the first shield film 61 and such that magnetic flux is less likely to be blocked.

Note that, in a case where the region where the bump electrodes 80 are provided is treated as the peripheral region 11, the central region 12 is a region positioned inside the peripheral region 11. In addition, the central region 12 includes the center of the one main surface 10a of the substrate 10 and is a region occupying 50% of the area of the one main surface 10a. In addition, the central region 12 may also be a region overlapping the integrated circuit device IC1 in a planar view.

The substrate 10 has a base material unit 15 formed by laminating a plurality of ceramic base materials, and a first inner conductor 16, a second inner conductor 17, and a plurality of ground electrodes 18 that are provided inside the substrate 10. Each of the first inner conductor 16, the second inner conductor 17, and the ground electrodes 18 is formed by, for example, a metal material with copper as the main component. Each of the first inner conductor 16 and the second inner conductor 17 is formed by an in-plane conductor and an interlayer conductor. The ground electrodes 18 are formed by an in-plane conductor, and are connected to the first shield film 61.

The second external terminal 22 of the switch circuit unit 20 is connected to the first terminal 31 of the matching circuit unit 30 with the first inner conductor 16 interposed therebetween. The second terminal 32 of the matching circuit unit 30 is connected to the first external terminal 41 of the amplifier circuit unit 40 with the second inner conductor 17 interposed therebetween. As a result of this connection, the switch circuit unit 20, the matching circuit unit 30, and the amplifier circuit unit 40 are connected in series in this order.

When the RF module 1 according to the present embodiment is viewed from a direction perpendicular to the one main surface 10a of the substrate 10 (the Z direction), the first terminal 31 of the matching circuit unit 30 is superposed with the second external terminal 22 of the switch circuit unit 20. The first terminal 31 and the second external terminal 22 are connected to each other with the shortest distance therebetween and with the first inner conductor 16 interposed therebetween. The first terminal 31 and the second external terminal 22 are connected to each other with the shortest length of wire, and as a result, a configuration is realized in which a parasitic capacitance is less likely to be generated between the wire connecting the first terminal 31 and the second external terminal 22 to each other and another wire (for example, the ground electrodes 18).

In addition, when the RF module 1 is viewed from the direction perpendicular to the one main surface 10a of the substrate 10, the second terminal 32 of the matching circuit unit 30 is superposed with the first external terminal 41 of the amplifier circuit unit 40. The second terminal 32 and the first external terminal 41 are connected to each other with the shortest distance therebetween and with the second inner conductor 17 interposed therebetween. The second terminal 32 and the first external terminal 41 are connected to each other with the shortest length of wire, and as a result a configuration is realized in which a parasitic capacitance is less likely to be generated between the wire connecting the second terminal 32 and the first external terminal 41 to each other and another wire (for example, the ground electrodes 18).

In addition, when the RF module 1 is viewed from the direction perpendicular to the one main surface 10a of the substrate 10, the first terminal 31 and the second terminal 32 of the matching circuit unit 30 are arranged so as not to be superposed with the ground electrodes 18. This arrangement results in a configuration in which a parasitic capacitance is less likely to be generated between the first terminal 31 or the second terminal 32 and each of the ground electrodes 18. In addition, the first inner conductor 16, the second inner conductor 17, and each of the ground electrodes 18 inside the substrate 10 are arranged so as not to be superposed with each other. This arrangement results in a configuration in which a parasitic capacitance is less likely to be generated between the first inner conductor 16 or the second inner conductor 17 and the ground electrode 18.

1-2. RF Module Manufacturing Method

Next, a manufacturing method for the RF module 1 will be described.

First, a ceramic pattern containing a ceramic material and an inner conductor pattern containing a conductor material are each printed in a predetermined pattern by using a printing lamination method using, for example, screen deposition, and a multilayer block serving as a base is formed by spreading on many layers of these patterns. Thereafter, the multilayer block is fired to form the substrate 10.

Next, the matching circuit unit 30 and the band pass filter 70 are mounted on the one main surface 10a of the substrate 10 by using a mounter. In addition, the integrated circuit device IC1, which is constituted by the switch circuit unit 20 and the amplifier circuit unit 40, is mounted on the other main surface 10b of the substrate 10. In addition, cylindrically shaped copper members are soldered to the other main surface 10b so as to form the plurality of bump electrodes 80. Thereafter, a resin is applied onto the one main surface 10a of the substrate 10 so as to cover the matching circuit unit 30 and the band pass filter 70, so that the first resin sealing portion 51 is formed. In addition, a resin is applied onto the other main surface 10b of the substrate 10 so as to cover the integrated circuit device IC1 and the bump electrodes 80, so that the second resin sealing portion 52 is formed. Next, in the direction perpendicular to the other main surface 10b (the Z direction), a portion of the second resin sealing portion 52, a portion of the integrated circuit device IC1, and a portion of the bump electrodes 80 are removed to match their heights. As a result of these removal processes, the integrated circuit device IC1 and the bump electrodes 80 are exposed from the front surface 52a of the second resin sealing portion 52. Next, shield films (the first shield film 61 and the second shield film 62) are simultaneously formed on the side surface 10c of the substrate 10, the side surface 51c and the top surface 51a of the first resin sealing portion 51, and the side surfaces 52c of the second resin sealing portion 52. As a result of these processes, the RF module 1 is manufactured.

1-3. Advantageous Effects and so on

The RF module 1 according to the present embodiment includes the substrate 10, the matching circuit unit 30 mounted on the one main surface 10a of the substrate 10, and the switch circuit unit 20 and the amplifier circuit unit 40 mounted on the other main surface 10b of the substrate 10. The amplifier circuit unit 40 has the first external terminal 41, and is mounted on the substrate 10 with the first external terminal 41 interposed therebetween. The switch circuit unit 20 has the second external terminal 22, and is mounted on the substrate 10 with the second external terminal 22 interposed therebetween. The matching circuit unit 30 has the first terminal 31 and the second terminal 32, which differ from each other, and is mounted on the substrate 10 with the first terminal 31 and the second terminal 32 interposed therebetween. The first terminal 31 is electrically connected to the second external terminal 22 of the switch circuit unit 20, and the second terminal 32 is electrically connected to the first external terminal 41 of the amplifier circuit unit 40. When viewed from the direction perpendicular to the one main surface 10a of the substrate 10, the first terminal 31 is superposed with the second external terminal 22 of the switch circuit unit 20, and the second terminal 32 is superposed with the first external terminal 41 of the amplifier circuit unit 40.

With this terminal arrangement, the first terminal 31 and the second external terminal 22 can be connected to each other with the shortest length of wire. Thus, a parasitic capacitance is less likely to be generated between the wire connecting the first terminal 31 and the second external terminal 22 to each other and another wire (for example, the ground electrodes 18). In addition, the second terminal 32 and the first external terminal 41 can be connected to each other with the shortest length of wire. Thus, a parasitic capacitance is less likely to be generated between the wire connecting the second terminal 32 and the first external terminal 41 to each other and another wire (for example, the ground electrodes 18). Consequently, degradation of the gain characteristics of the amplifier circuit unit 40 due to a generated parasitic capacitance can be suppressed.

Note that, regarding the first terminal 31 and the second external terminal 22 as well as the second terminal 32 and the first external terminal 41, the terminals of these pairs do not always have to be superposed with each other, and it is sufficient that the terminals of at least one of the pairs are superposed with each other. That is, it is sufficient that, when viewed from the direction perpendicular to the one main surface 10a of the substrate 10, the RF module 1 has at least one of a state in which the first terminal 31 and the second external terminal 22 are superposed with each other and a state in which the second terminal 32 and the first external terminal 41 are superposed with each other.

In addition, the second terminal 32 may be partially superposed with the first external terminal 41, and the entirety of the second terminal 32 may be superposed with the first external terminal 41. In FIG. 2B, the first external terminal 41 has a larger area than the second terminal 32; however, the first external terminal 41 may have a smaller area than the second terminal 32. The same as above applies to the relationship between the first terminal 31 and the second external terminal 22.

Second Embodiment

Next, an RF module 1A according to a second embodiment will be described. The RF module 1A according to the second embodiment has three RF signal channels.

Figure 3:
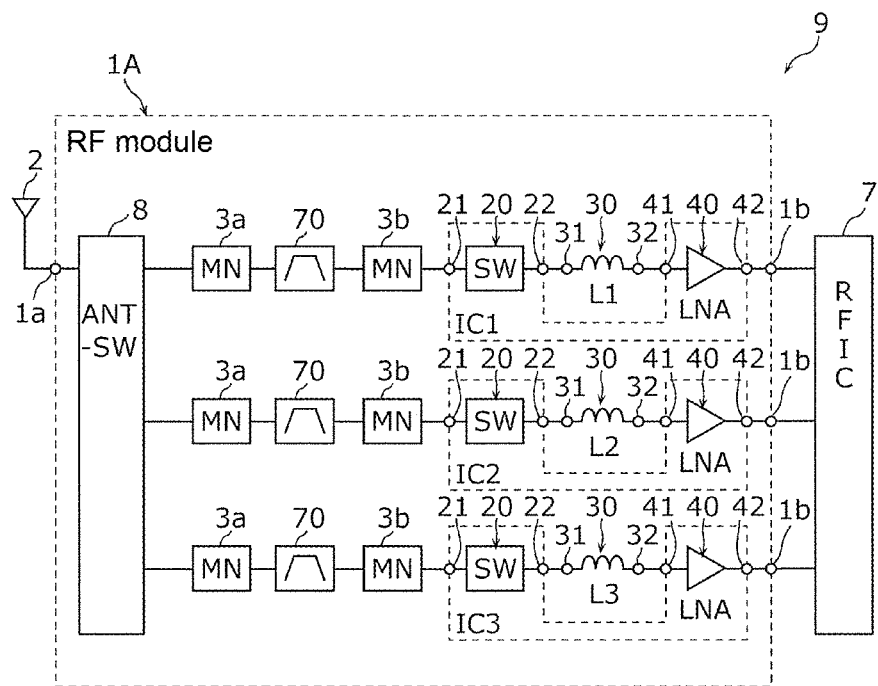
FIG. 3 is a diagram illustrating a circuit configuration of an RF module according to a second embodiment.

FIG. 3 is a diagram illustrating the circuit configuration of the RF module 1A.

As illustrated in FIG. 3, the RF module 1A has the antenna terminal 1a and three input-output terminals 1b. The antenna element 2 is connected to the antenna terminal 1a, and the RFIC 7 is connected to the three input-output terminals 1b.

The RF module 1A has an antenna switch 8 and the three RF signal channels in the channel connecting the antenna terminal 1a to the input-output terminals 1b. The antenna switch 8 has one common terminal and three selection terminals. Each RF signal channel has the matching element (MN) 3a, the band pass filter 70, the matching element (MN) 3b, the switch circuit unit 20, the matching circuit unit 30, and the amplifier circuit unit 40. In the present embodiment, the integrated circuit device IC1 and integrated circuit devices IC2 and IC3 are arranged so as to correspond to the respective RF signal channels. Each of the integrated circuit devices IC1 to IC3 includes the switch circuit unit 20 and the amplifier circuit unit 40.

Figure 4:
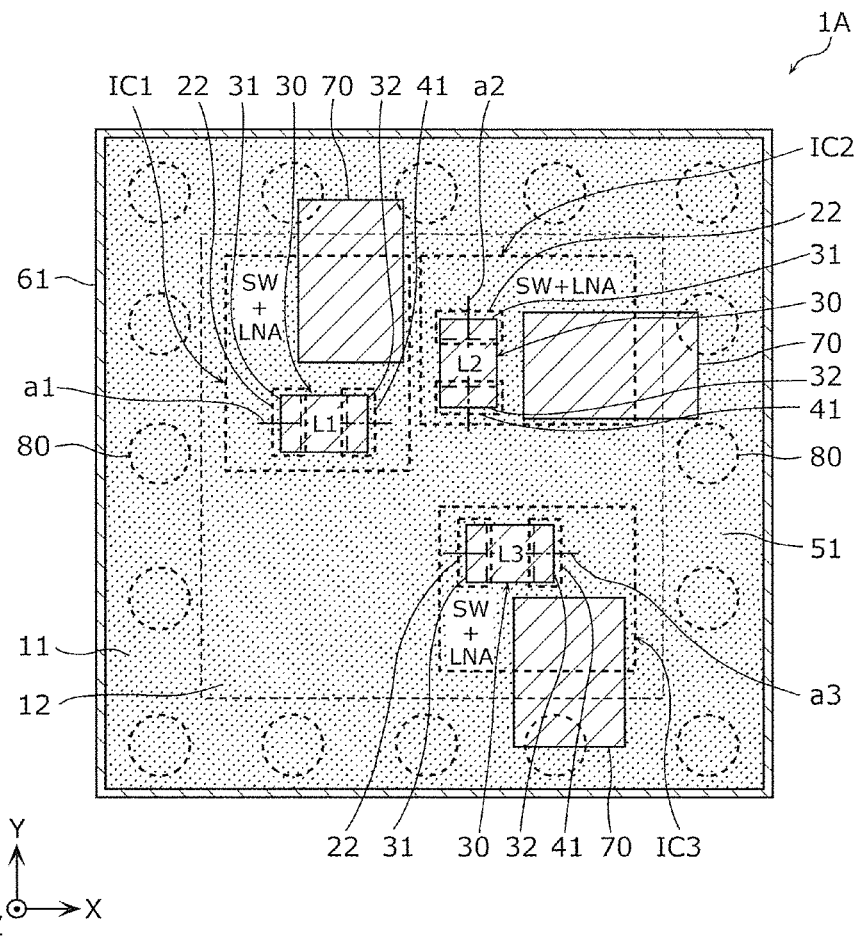
FIG. 4 is a cross section of the RF module according to the second embodiment when the RF module is viewed in a planar view.

FIG. 4 is a cross section of the RF module 1A when the RF module 1A is viewed in a planar view (viewed in a direction perpendicular to one main surface 10a of a substrate 10).

As illustrated in FIG. 4, the RF module 1A includes the substrate 10, the three matching circuit units 30 and three band pass filters 70 mounted on the one main surface 10a of the substrate 10, and the three integrated circuit devices IC1 to IC3 mounted on the other main surface 10b. In addition, a power supply circuit is provided on the one main surface 10a of the substrate 10.

Each of the three band pass filters 70 is a filter used in a corresponding one of frequency bands that are a middle band, a high band, and an ultra high band.

In each of the integrated circuit devices IC1 to IC3, the switch circuit unit 20 is soldered to the other main surface 10b of the substrate 10 with at least the second external terminal 22 interposed therebetween, and the amplifier circuit unit 40 is soldered to the other main surface 10b of the substrate 10 with at least the first external terminal 41 interposed therebetween.

The matching circuit unit 30 is, for example, a chip inductor. Each of the three matching circuit units 30 has, as its outer shape, a rectangular parallelepiped shape, and the first terminal 31 and the second terminal 32, which are a pair of terminals, are provided at both ends or on the bottom surface. The matching circuit unit 30 is soldered to the one main surface 10a of the substrate 10 with the first terminal 31 and the second terminal 32 interposed therebetween.

Each of the three matching circuit units 30 is arranged in the central region 12 of the substrate 10 so as not to be too close to the first shield film 61.

Among the three matching circuit units 30, the matching circuit unit 30 connected to the integrated circuit device IC1 and arranged in a middle-band RF signal channel is mounted on the substrate 10 such that the coil axis a1 of the inductor is parallel to the X direction. Among the three matching circuit units 30, the matching circuit unit 30 connected to the integrated circuit device IC2 and arranged in a high-band RF signal channel is mounted on the substrate 10 such that a coil axis a2 of the inductor is parallel to the Y direction. Among the three matching circuit units 30, the matching circuit unit 30 connected to the integrated circuit device IC3 and arranged in an ultra-high-band RF signal channel is mounted on the substrate 10 such that a coil axis a3 of the inductor is parallel to the X direction.

That is, the three matching circuit units 30 are arranged such that the coil axes a1 and a3 and the coil axis a2 of the inductors intersect (specifically, orthogonal to each other) and are each arranged so as to be less likely to block magnetic flux of the other inductors. In addition, the two matching circuit units 30 each having a corresponding one of the coil axes a1 and a3 are arranged such that the coil axis a1 and coil axis a3 of the inductors are parallel to each other. Specifically, the matching circuit unit 30 having the coil axis a3 is arranged such that the coil axis a3 and the coil axis a1 are not on the same axis and the coil axis a3 is spaced apart from the coil axis a1 in the Y direction, thereby being less likely to block magnetic flux of the matching circuit unit 30 having the coil axis a1. In addition, in the present embodiment, the coil axes of two adjacent matching circuit units 30 among the three matching circuit units 30 are orthogonal to each other. Specifically, the matching circuit unit 30 having the coil axis a1 and the matching circuit unit 30 having the coil axis a2 are arranged so as to be next to each other and such that the coil axis a1 is orthogonal to the coil axis a2. In addition, the matching circuit unit 30 having the coil axis a2 and the matching circuit unit 30 having the coil axis a3 are arranged so as to be next to each other and such that the coil axis a2 is orthogonal to the coil axis a3.

In this manner, each of the matching circuit units 30 is oriented such that the matching circuit 30 is less likely to block magnetic flux of the other matching circuit units 30, thereby being less likely to interfere with the other matching circuit units 30 and suppressing occurrence of magnetic field coupling. Consequently, degradation of attenuation characteristics due to signal leakage from each RF signal channel can be suppressed.

In addition, when the RF module 1A according to the present embodiment is viewed from the direction perpendicular to the one main surface 10a of the substrate 10, the first terminal 31 of each matching circuit unit 30 is superposed with the second external terminal 22 of a corresponding one of the switch circuit units 20. Specifically, the three first terminals 31 are connected to the three second external terminals 22 with the shortest distances therebetween and with the corresponding first inner conductors interposed therebetween. In this manner, the first terminals 31 and the corresponding second external terminals 22 are connected to each other with the shortest length of wire, and as a result a configuration is realized in which a parasitic capacitance is less likely to be generated between the wires connecting the first terminals 31 and the corresponding second external terminals 22 to each other and another wire (for example, the ground electrodes 18).

In addition, when the RF module 1A is viewed from the direction perpendicular to the one main surface 10a of the substrate 10, the second terminal 32 of each matching circuit unit 30 is superposed with the first external terminal 41 of a corresponding one of the amplifier circuit units 40. Specifically, the three second terminals 32 are connected to the three first external terminals 41 with the shortest distances therebetween and with the corresponding second inner conductors interposed therebetween. In this manner, the second terminals 32 and the corresponding first external terminals 41 are connected to each other with the shortest length of wire, and as a result a configuration is realized in which a parasitic capacitance is less likely to be generated between the wires connecting the second terminals 32 and the corresponding first external terminals 41 to each other and another wire (for example, the ground electrodes 18).

With these configurations, in the RF module 1A, degradation of gain characteristics of the amplifier circuit unit 40 due to a generated parasitic capacitance can be suppressed.

Third Embodiment

Next, an RF module 1B according to a third embodiment will be described. In the RF module 1B according to the third embodiment, a bottom portion 81 of a bump electrode 80 is thick and the bottom portion 81 is connected to the second shield film 62.

Figure 5:
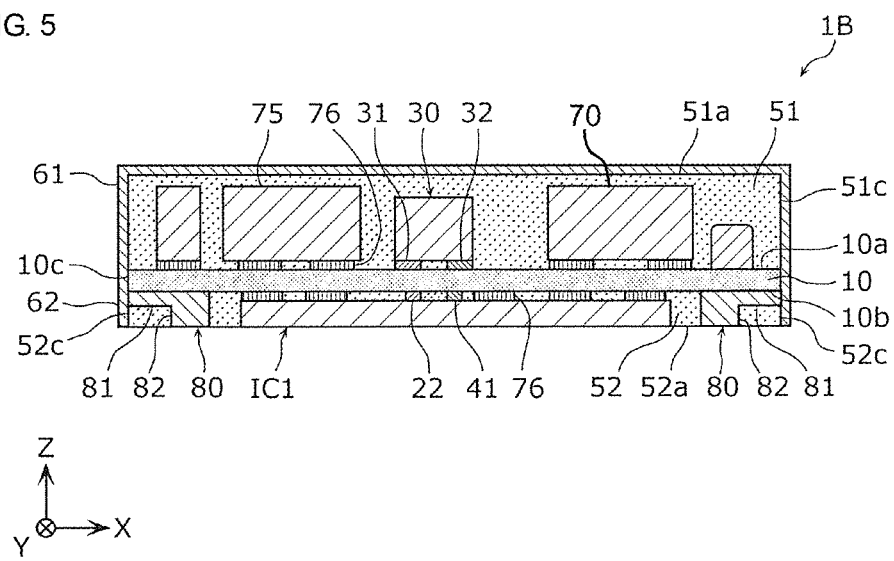
FIG. 5 is a cross section of an RF module according to a third embodiment when the RF module is viewed from the front.

FIG. 5 is a cross section of the RF module 1B when the RF module 1B is viewed from the front.

As illustrated in FIG. 5, the RF module 1B includes the substrate 10, the matching circuit unit 30 mounted on the one main surface 10a of the substrate 10, and the integrated circuit device IC1 mounted on the other main surface 10b. A plurality of mount components 75 are joined to the one main surface 10a of the substrate 10 using a joining member 76 such as solder.

The RF module 1B has a plurality of bump electrodes 80, and some of the bump electrodes 80 are electrodes connected to the ground. As illustrated in FIG. 5, each bump electrode 80 connected to the ground has the bottom portion 81, which is in contact with the other main surface 10b of the substrate 10, and a leading-end portion 82 positioned farthest from the bottom portion 81 that is not in direct contact with the other main surface 10b of the substrate 10. The leading-end portion 82 is exposed from the front surface 52a of the second resin sealing portion 52. A portion of the bottom portion 81 is exposed from a side surface 52c of the second resin sealing portion 52 along the other main surface 10b of the substrate 10, and is connected to the second shield film 62.

In the RF module 1B according to the present embodiment, the bump electrodes 80 connected to the ground are connected to the second shield film 62. Consequently, the ground contact area of the electrodes connected to the shield film is increased and the resistance value can be decreased, thereby improving the shield performance. For example, the ground contact area of a case where only the ground electrodes of the substrate 10 are connected to the shield film is 10 µm$^2$, whereas the ground contact area of a case where, as in the RF module 1B, the bump electrodes 80 are also connected to the shield film can be 100 µm$^2$ (10 times).

In addition, in a case where the RF module 1B is mounted on a motherboard (another mounting substrate), the bump electrodes 80 can be connected to the second shield film 62 at positions close to the motherboard, thereby improving the shield performance.

Next, a manufacturing method for the RF module 1B will be described.

First, a first constrained layer and a second constrained layer are stacked in order on the side where the other main surface 10b of the substrate 10, which is unfired, is provided, and an unfired composite multilayer body is formed. Each of the first and second constrained layers is composed of a base material and a bump electrode pattern. The base material contains a material that is not practically sintered at the firing temperature of the substrate 10. The bump electrode pattern contains a metal material that is sintered at a temperature less than or equal to the firing temperature of the substrate 10. Specifically, the first constrained layer is formed such that a bump electrode pattern having a shape corresponding to the bottom portions 81 penetrates through the base material of the first constrained layer. The second constrained layer is formed such that a bump electrode pattern having a shape corresponding to the leading-end portions 82 penetrates through the second constrained layer.

Next, the composite multilayer body described above is fired at the firing temperature of the substrate 10. As a result of this firing, the bump electrode pattern is sintered and the bump electrodes 80 are formed. In contrast, the base material portion of the first and second constrained layers is not sintered.

Next, the base material portion that is not sintered is removed from the composite multilayer body. As a result of this removal process, the bump electrodes 80 having a step shape having the bottom portion 81 and the leading-end portion 82 appear on the other main surface 10b of the substrate 10.

Next, the matching circuit unit 30 and the band pass filter 70 are mounted on the one main surface 10a of the substrate 10 by using a mounter. In addition, the integrated circuit device IC1, which includes the switch circuit unit 20 and the amplifier circuit unit 40, is mounted on the other main surface 10b of the substrate 10. Thereafter, a resin is applied onto the one main surface 10a of the substrate 10 so as to cover the matching circuit unit 30 and the band pass filter 70, so that the first resin sealing portion 51 is formed. In addition, a resin is applied onto the other main surface 10b of the substrate 10 so as to cover the integrated circuit device IC1 and the bump electrodes 80, so that the second resin sealing portion 52 is formed. Next, shield films (the first shield film 61 and the second shield film 62) are simultaneously formed on the side surface 10c of the substrate 10, the side surface 51c and the top surface 51a of the first resin sealing portion 51, and the side surfaces 52c of the second resin sealing portion 52.

As a result of the processes described above, the RF module 1B is manufactured. According to the processes, many bump electrodes 80 having different shapes can be easily formed.

Fourth Embodiment

Next, an RF module 1C according to a fourth embodiment will be described. In the RF module 1C according to the fourth embodiment, the leading-end portions 82 of the bump electrodes 80 are thicker than the bottom portions 81.

Figure 6:
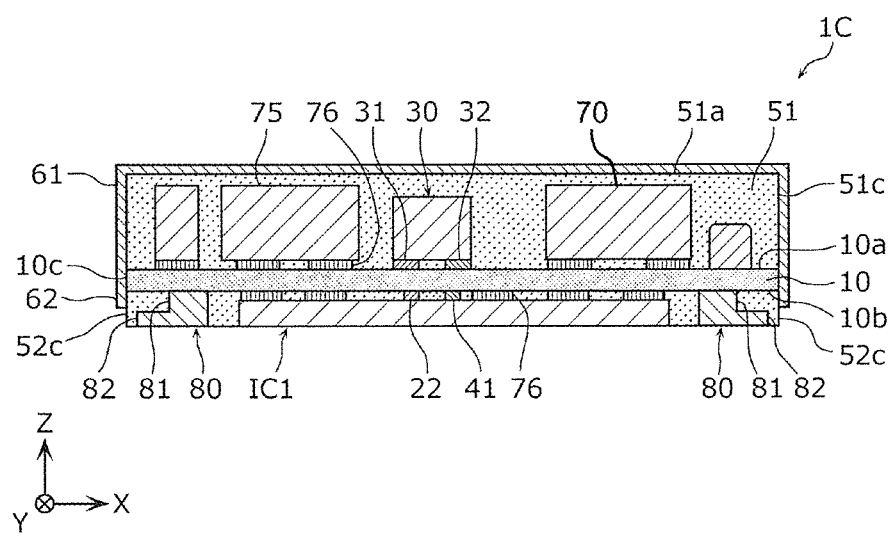
FIG. 6 is a cross section of an RF module according to a fourth embodiment when the RF module is viewed from the front.

FIG. 6 is a cross section of the RF module 1C when the RF module 1C is viewed from the front.

As illustrated in FIG. 6, the RF module 1C includes the substrate 10, the matching circuit unit 30 mounted on the one main surface 10a of the substrate 10, and the integrated circuit device IC1 mounted on the other main surface 10b. The plurality of mount components 75 are joined to the one main surface 10a of the substrate 10 using the joining member 76 such as solder.

The RF module 1C has the plurality of bump electrodes 80. Each bump electrode 80 has, as illustrated in FIG. 6, the bottom portion 81 that is in contact with the other main surface 10b of the substrate 10 and the leading-end portion 82 positioned farthest from the bottom portion 81. The leading-end portion 82 has a larger cross-sectional area than the bottom portion 81, and is exposed from the front surface 52a of the second resin sealing portion 52. The cross-sectional area is the area of a surface of the bump electrode 80, the surface being taken so as to be perpendicular to a protrusion direction of the bump electrode 80 (the Z direction).

Note that in order to make the cross-sectional area of the leading-end portion 82 of the bump electrode 80 be larger than the cross-sectional area of the bottom portion 81, it is sufficient that the area of the leading-end portion 82 of the bump electrode 80 is made to be larger than the area of the bottom portion 81 when the inner conductor pattern is printed in the RF module manufacturing method described in the third embodiment.

In the RF module 1C according to the present embodiment, the cross-sectional area of the leading-end portion 82 of the bump electrode 80 is large, and thus in a case where the RF module 1C is mounted on a motherboard (another mounting substrate), a large area can be used to connect to the motherboard, thereby increasing the mounting strength.

Other Embodiments

The RF modules according to the first to fourth embodiments of the present disclosure have been described above; however, the present disclosure is not limited to each of the first to fourth embodiments. Without necessarily departing from the gist of the present disclosure, the first to fourth embodiments with various modifications that those skilled in the art can conceive and modes realized by combining structural elements from different embodiments may also be included in the scope of one or a plurality of modes of the present disclosure.

In the present embodiments, the switch circuit unit 20 and the amplifier circuit unit 40 are integrally formed as the integrated circuit device IC1; however, they do not have to be integrally formed. For example, the switch circuit unit 20 and the amplifier circuit unit 40 may also be configured as separate circuit devices.

In the present embodiments, the switch circuit unit 20 and the amplifier circuit unit 40 are mounted on the other main surface 10b of the substrate 10; however, they do not have to be mounted there. For example, the switch circuit unit 20 and the amplifier circuit unit 40 may also be embedded in the inside of the substrate 10 and be built in the substrate 10. The band pass filter 70 may also be embedded in the inside of the substrate 10 and be built in the substrate 10.

In the present embodiments, as the matching circuit unit 30, the chip inductor is shown by example; however, the matching circuit unit 30 does not have to be a chip inductor. The matching circuit unit 30 may also be a composite part in which an inductor device and another passive device are built. For example, the matching circuit unit 30 may also be configured by a capacitor inserted in series between the switch circuit unit 20 and the amplifier circuit unit 40 and an inductor that is shunt-connected. In addition, the matching circuit unit 30 is not limited to a laminated inductor, and may also be a winding inductor.

In the first embodiment, the RF module 1 has been described as the receiving circuit; however, the RF module 1 does not have to be the receiving circuit and may also be a transmission circuit. In that case, the amplifier circuit unit 40 serves as a power amplifier (PA), the first external terminal 41, which is an output terminal of the amplifier circuit unit 40, is connected to the second terminal 32 of the matching circuit unit 30, and the first terminal 31 of the matching circuit unit 30 is connected to the second external terminal 22, which is an input terminal of the switch circuit unit 20.

In addition, in the RF module manufacturing method, the multilayer block does not have to be formed by using the printing lamination method and may also be formed by using a sheet lamination method.

INDUSTRIAL APPLICABILITY

The RF modules according to the present disclosure can be widely used as a component part of electronic devices such as a portable information terminal.

REFERENCE SIGNS LIST 1, 1A, 1B, 1C RF module
1a antenna terminal
1b input-output terminal
2 antenna element
3a, 3b matching element (MN)
7 RFIC
8 antenna switch
9 communication device
10 substrate
10a one main surface
10b the other main surface
10c side surface
11 peripheral region
12 central region
15 base material unit
16 first inner conductor
17 second inner conductor
18 ground electrode
20 switch circuit unit (SW)
20c side surface of switch circuit unit
21 first external terminal
22 second external terminal
30 matching circuit unit
31 first terminal
32 second terminal
40 amplifier circuit unit (LNA)
40c side surface of amplifier circuit unit
41 first external terminal
42 second external terminal
51 first resin sealing portion
51a top surface of first resin sealing portion
51c side surface of first resin sealing portion
52 second resin sealing portion
52a front surface of second resin sealing portion
52c side surface of second resin sealing portion
61 first shield film
62 second shield film
70 band pass filter
75 mount component
76 joining member
80 bump electrode
80c side surface of bump electrode
81 bottom portion
82 leading-end portion
L1, L2, L3 inductor
a1, a2, a3 coil axis
IC1, IC2, IC3 integrated circuit device

The invention claimed is:

1. A radio frequency module comprising:
a substrate;
a matching circuit unit mounted on one main surface of the substrate; and
a switch circuit unit and an amplifier circuit unit mounted on another main surface or in an inside of the substrate, wherein the amplifier circuit unit has a first external terminal and is mounted on the substrate with the first external terminal interposed therebetween,
the switch circuit unit has a second external terminal and is mounted on the substrate with the second external terminal interposed therebetween,
the matching circuit unit has a first terminal and a second terminal, which are different from each other, and is mounted on the substrate with the first and second terminals interposed therebetween,
the first terminal is electrically connected to the second external terminal of the switch circuit unit,
the second terminal is electrically connected to the first external terminal of the amplifier circuit unit, and
when viewed from a direction perpendicular to the one main surface of the substrate,
the radio frequency module has at least one of a state in which the first terminal is superposed with the second external terminal of the switch circuit unit and a state in which the second terminal is superposed with the first external terminal of the amplifier circuit unit.

2. The radio frequency module according to claim 1, wherein
when viewed from the direction perpendicular to the one main surface of the substrate,
at least, the second terminal is superposed with the first external terminal of the amplifier circuit unit.

3. The radio frequency module according to claim 1, further comprising:
a first resin sealing portion provided on the one main surface of the substrate so as to cover the matching circuit unit; and
a first shield film provided to cover a side surface of the substrate and a side surface of the first resin sealing portion,
wherein
when viewed from the direction perpendicular to the one main surface of the substrate,
the matching circuit unit is arranged in a central region of the substrate.

4. The radio frequency module according to claim 1, wherein the matching circuit unit is a chip inductor and is inserted between the switch circuit unit and the amplifier circuit unit such that the switch circuit unit, the matching circuit unit, and the amplifier circuit unit are connected in series.

5. The radio frequency module according to claim 4, wherein the chip inductor is mounted on the substrate such that a coil axis is parallel to the one main surface of the substrate.

6. The radio frequency module according to claim 4, further comprising:
one or more chip inductors,
wherein at least two of the chip inductors are mounted on the substrate such that a coil axis of one of the chip inductors intersects with a coil axis of the other chip inductor.

7. The radio frequency module according to claim 6, wherein the coil axis of the one of the chip inductors is orthogonal to the coil axis of the other chip inductor.

8. The radio frequency module according to claim 6, further comprising:
a band pass filter connected to the switch circuit unit, wherein the band pass filter is mounted on the other main surface or in the inside of the substrate.

9. The radio frequency module according to claim 1,
wherein the switch circuit unit and the amplifier circuit unit are mounted on the other main surface of the substrate, the radio frequency module further comprising:

a bump electrode that protrudes from the other main surface of the substrate;

a second resin sealing portion formed on the other main surface of the substrate so as to cover a side surface of the switch circuit unit and a side surface of the amplifier circuit unit as well as a side surface of the bump electrode; and a second shield film formed so as to cover a side surface of the second resin sealing portion.

10. The radio frequency module according to claim 9, wherein the bump electrode has a bottom portion that is in direct contact with the other main surface and a leading-end portion that is not in direct contact with the bottom portion, the leading-end portion is exposed from a front surface of the second resin sealing portion, and a portion of the bottom portion is exposed from the side surface of the second resin sealing portion along the other main surface of the substrate and is connected to the second shield film.

11. The radio frequency module according to claim 9, wherein the bump electrode has a bottom portion that is in contact with the other main surface and a leading-end portion positioned farthest from the bottom portion, and the leading-end portion has a cross-sectional area larger than a cross-sectional area of the bottom portion, and the leading-end portion is exposed from a front surface of the second resin sealing portion.

12. The radio frequency module according to claim 2, further comprising:

a first resin sealing portion provided on the one main surface of the substrate so as to cover the matching circuit unit; and a first shield film provided to cover a side surface of the substrate and a side surface of the first resin sealing portion, wherein when viewed from the direction perpendicular to the one main surface of the substrate, the matching circuit unit is arranged in a central region of the substrate.

13. The radio frequency module according to claim 2, wherein the matching circuit unit is a chip inductor and is inserted between the switch circuit unit and the amplifier circuit unit such that the switch circuit unit, the matching circuit unit, and the amplifier circuit unit are connected in series.

14. The radio frequency module according to claim 2, wherein the matching circuit unit is a chip inductor and is inserted between the switch circuit unit and the amplifier circuit unit such that the switch circuit unit, the matching circuit unit, and the amplifier circuit unit are connected in series.

15. The radio frequency module according to claim 5, further comprising:

one or more chip inductors, wherein at least two of the chip inductors are mounted on the substrate such that a coil axis of one of the chip inductors intersects with a coil axis of the other chip inductor.

* * * * *